United States Patent [19]

Nakajima et al.

[11] Patent Number: 4,592,791
[45] Date of Patent: Jun. 3, 1986

[54] LIQUID PHASE EPITAXIAL GROWTH METHOD FOR PRODUCING A III-V GROUP COMPOUND SEMICONDUCTOR

[75] Inventors: Kazuo Nakajima, Kawasaki; Toshiyuki Tanahashi, Atsugi, both of Japan

[73] Assignee: Fujitsu Limited, Kawasaki, Japan

[21] Appl. No.: 553,896

[22] Filed: Nov. 21, 1983

[30] Foreign Application Priority Data

Nov. 22, 1982 [JP] Japan .................... 57-204816

[51] Int. Cl.⁴ .................... H01L 21/208
[52] U.S. Cl. .................... 148/171; 148/172; 148/173; 29/569 L
[58] Field of Search ............ 148/171, 172; 29/569 L

[56] References Cited

U.S. PATENT DOCUMENTS

| | | | |
|---|---|---|---|
| 3,933,538 | 1/1976 | Akai et al. | 148/171 |
| 4,096,511 | 6/1978 | Gurnell | 148/171 X |
| 4,122,407 | 10/1978 | Van Vechten | 148/171 X |
| 4,246,050 | 1/1981 | Moon | 148/171 |
| 4,321,556 | 3/1982 | Sakuma | 148/171 X |
| 4,326,176 | 4/1982 | Aiki et al. | 29/569 L |
| 4,342,148 | 8/1982 | Spring-Thorpe | 148/171 X |
| 4,354,898 | 10/1982 | Coldren et al. | 29/569 L |
| 4,372,791 | 2/1983 | Hsieh | 29/569 L |
| 4,468,258 | 8/1984 | Pfister et al. | 148/172 X |

OTHER PUBLICATIONS

Japanese Journal of Applied Physics, vol. 21, No. 4, Part 2, Apr. 1982, pp. L237-L239, Tokyo, JP, K. Nakajima et al.: "Direct LPE Growth of InP on (111)A Oriented $In_{0.53}Ga_{0.47}$ as Without Dissolution".

Journal of Crystal Growth, vol. 27, 1974, pp. 142–147, North-Holland Publishing Co. M. G. Astles et al.: "Nucleation and Growth of $Ga_{1-x}Al_xAs$ On (111) GaP".

Applied Physics Letters, vol. 41, No. 2, Jul. 1982, pp. 194–196, American Institute of Physics, New York, US, K. Nakajima, et al.: "Liquid Phase Epitaxial Growth of Lattice-Matched $Al_{0.48}In_{0.5}As$ on InP".

Primary Examiner—George T. Ozaki
Attorney, Agent, or Firm—Armstrong, Nikaido, Marmelstein & Kubovcik

[57] ABSTRACT

A liquid phase epitaxial growth method is disclosed wherein (111)A InP substrate is used for growing an epitaxial layer of $Al_xIn_{1-x}As$ or $Al_xGa_yIn_{1-x-y}As$ compound semiconductor by liquid phase epitaxy.

6 Claims, 17 Drawing Figures

200 µm

200 µm

LIQUID PHASE EPITAXIAL GROWTH METHOD FOR PRODUCING A III-V GROUP COMPOUND SEMICONDUCTOR

BACKGROUND OF THE INVENTION

1. Field of the Invention

The present invention relates to a method of growing a III-V group compound semiconductor by using liquid phase epitaxial growth, and in particular, to liquid phase epitaxial growth of lattice matched aluminum-indium-arsenide ($Al_xIn_{1-x}As$) crystal and aluminum-gallium-indium-arsenide ($Al_xGa_yIn_{1-x-y}As$) crystal onto indium phosphide (InP) crystal.

2. Description of Prior Art

The aluminum-indium-arsenide compound ($Al_xIn_{1-x}As$) crystal realizes the lattice matching of the indium phosphide compound (InP) crystal, when $x=0.48$ and its forbidden band gap is about 1.45 eV which is larger than that (about 1.35 eV) of InP.

Therefore, when the $Al_{0.48}In_{0.52}As$ crystal is used in place of the conventional InP crystal, or together therewith, as the carrier confining layer of a semiconductor light emitting device (where the InP crystal is used as a substrate and, for example, the indium-gallium-arsenic-phosphide (InGaAsP) or indium-gallium-arsenide (InGaAs) crystal is used as an active layer) or as the window layer of a semiconductor photo detector device (where these crystals are used as the photo absorbing layer), it is expected that the performance of these photo semiconductor devices will improve.

Moreover, the AlInAs has a Schottky barrier height which is larger than that of, for example, InP or InGaAs, which suggest the possibility of its application as a Schottky gate field effect transistor, etc.

Meanwhile, an aluminum-gallium-indium-arsenide compound ($Al_xGa_yIn_{1-x-y}As$) crystal is capable of realizing lattice matching to the InP crystal, when it is formed of a composition having the requirements: $0<x<0.48$, $0<y<0.47$; and its forbidden band gap is from about 0.74 to 1.45 eV.

This forbidden band gap is wider than that of about 0.74 to 1.35 eV for a composition which realizes lattice matching between the InGaAsP crystal and InP crystal; and accordingly, the $Al_{0.48}In_{0.52}As$ and $Al_xGa_yIn_{1-x-y}As$ crystals have been anticipated as useful for wide application. For example, a light emitting device which emits the light in the wavelength of 0.85 μm to 1.68 μm or a photo detector device having photo sensitivity within this range may be obtained by combining $Al_{0.48}In_{0.52}As$ and $Al_xGa_yIn_{1-x-y}As$.

In regard to the hetero epitaxial growth of the $Al_{0.48}In_{0.52}As$ crystal on the InP crystal plane, an example using molecular beam epitaxial growth method has been already proposed. Also, the liquid phase epitaxial growth method was proposed by an inventor of this application in the *Appl. Phys. Lett.*, Vol. 41, No. 2, pages 194–6 (1982). In addition, liquid phase epitaxial growth of $Al_xGa_yIn_{1-x-y}As$ crystal on the InP crystal plane is also proposed by an inventor of this application in the *J. Crystal Growth*, Vol. 54, page 232 (1981). In these examples of the epitaxial growth on the InP crystal of the AlInAs or GaInAs crystals, the crystal is grown on the (100) plane of InP crystal. However, when these crystals, particularly when AlInAs is formed by the liquid phase epitaxial growth on the (100) crystal plane of InP, many crystal defects reaching the surface of AlInAs layer are generated, which can be seen in a microphotograph.

The cause of such crystal defects believed to be because of the following: Intrinsically, a three-element liquid of Al-In-As or four-element liquid of Al-Ga-In-As which are growth liquids of these crystals is not equilibrated with the two-element solid phase InP crystal. Moreover, it is difficult to super cool these growth liquids, and therefore, the InP crystal is easily soluble into these growth liquids. On the other hand, the atomic fraction of Al, $X_{Al}^l$, in these growth liquids is usually as small as $5\times10^{-4}$ to $8\times10^{-4}$; and the AlInAs or AlGaInAs crystal shows a low crystal growth rate, particularly when the composition ratio of Al is large. For example, about three minutes is required for liquid phase growth of 0.1 μm of the AlInAs at a temperature of 780° C.

Therefore, a crystal such as AlInAs gradually increases its thickness after the InP crystal is placed in contact with these growth liquids, and the InP crystal dissolves into the liquid. In particular, a deflective area such as a dislocated part quickly dissolves, which expands the defective area, thereby causing many defects to occur when the AlInAs or AlGaInAs crystals are grown on the InP crystal.

It is believed that raising, for example, the growth temperature, is a means for promoting crystal growth of AlInAs, etc. However, if a growth temperature is increased, decomposition of phosphorus (P) from the InP crystal is accelerated and defects of the AlInAs crystal are further increased.

SUMMARY OF THE INVENTION

It is an object of the present invention to provide a method of manufacturing an $Al_xIn_{1-x}As$ crystal or $Al_xGa_yIn_{1-x-y}As$ crystal using lattice matching to the InP crystal by the liquid phase epitaxial growth method, without generation of aforementiond crystal defects.

The object of this invention can be attained by the liquid phase epitaxial growth method wherein an $Al_xIn_{1-x}As$ crystal or $Al_xGa_yIn_{1-x-y}As$ crystal is grown on the crystal plane (111)A of the III-V group compound crystal formed on the (111)A crystal plane of the InP crystal or on said InP crystal. However, as explained above, the (111)A crystal plane may be replaced with any of the InP crystal used as a substrate or the III-V group compound crystal epitaxially grown on said substrate.

The (111)A plane of a crystal such as InP is chemically very stable when compared to, for example, the (100) plane or (111)B plane, etc. This is understood, because its etching speed is low, for example, when compared to other crystals. In this invention, when the growth liquid of Al-In-As or Al-Ga-In-As is in contact with the (111)A crystal plane, any melt-back does not occur.

BRIEF DESCRIPTION OF THE DRAWINGS

The present invention will become more aparent from the description of the preferred embodiments set forth below, with reference to the accompanying drawings, wherein.

Liquid phase epitaxial (LPE) growth conditions for lattice-matching are described below:

$Al_xIn_{1-x}As$ and $Al_xGa_yIn_{1-x-y}As$ epitaxial layers were grown onto both InP (111)A and (100) substrates by the LPE method. The (100) substrate was used as a control sample for comparison. The solution compositions for the growth were determined on the basis of the previously calculated phase diagrams. These values are listed in Tables I and II. The experimental apparatus consisted of a horizontal furnace system and a conventional sliding graphite boat, as reported previously. Pd-purified $H_2$ was flowed through the fused silica tube set in the furnace. The materials used were semiconductor grade Al, In, GaAs and InAs. An AlIn mother alloy, which contained 0.1 atomic percent (a/o) Al, was used as the Al source, because it was very difficult to dissolve Al into In melts directly at the growth temperatures. This is because of the miscibility gap in the liquid state of the Al and In binary system.

At the start of the growth runs, the furnace was heated rapidly to 30°–40° C. above the starting growth temperature, and the growth solution was held there for about 30 min. The growth solution was then cooled with a constant cooling rate of 0.5° C./min. Prior to growth, the thermally damaged surface of the InP substrates was removed using an undersaturated In+P solution.

For the growth of $Al_xIn_{1-x}As$, the temperatures of 685°, 770° and 790° C. were respectively used as the starting growth temperature. The exact amount of supercooling was not clear because of the lack of an experimental phase diagram, but is is assured that the epitaxial layers were grown from supercooled solutions. When the growth temperature interval was 9° C., the thickness of epitaxial layers grown on InP (111)A substrates was 0.1 and 0.5 μm for the starting growth temperatures of 685° and 790° C., respectively.

Lattice constants of these layers were measured by a double crystal x-ray diffraction technique. The measured results are listed in Table I.

TABLE I

Starting growth temperatures, solution compositions substrate orientations, lattice constants a (Å) and energy gaps $E_g$ (eV) at 300K for $Al_xIn_{1-x}As$ grown on InP substrates

| Starting growth temperature (°C.) | $X_{Al}{}^l$ | $X_{As}{}^l$ | $X_{In}{}^l$ | Face | a (Å) | $E_g$ (eV) |
|---|---|---|---|---|---|---|
| 685 | 0.00026 | 0.077 | 0.92274 | (111)A | 5.886 | — |
|  | 0.00027 | 0.076 | 0.92373 |  | 5.881 | — |
|  | 0.00030 | 0.070 | 0.9297 |  | 5.864 | — |
| 770 | 0.00067 | 0.1399 | 0.85943 | (111)A | 5.8825 | 1.425 |
|  | 0.00068 | 0.139 | 0.86032 |  | 5.885 | 1.431 |
|  | 0.00070 | 0.138 | 0.8613 |  | 5.880–5.882 | 1.437 |
|  | 0.00073 | 0.134 | 0.86527 |  | 5.870 | 1.443 |
| 790 | 0.00075 | 0.162 | 0.8372 | (111)A | 5.914 | — |
|  | 0.00080 | 0.157 | 0.8422 |  | 5.885 | — |
|  | 0.00085 | 0.152 | 0.8471 |  | 5.870–5.872 | 1.44 |
|  | 0.00090 | 0.147 | 0.8521 |  | 5.861 | — |

Figure 1:
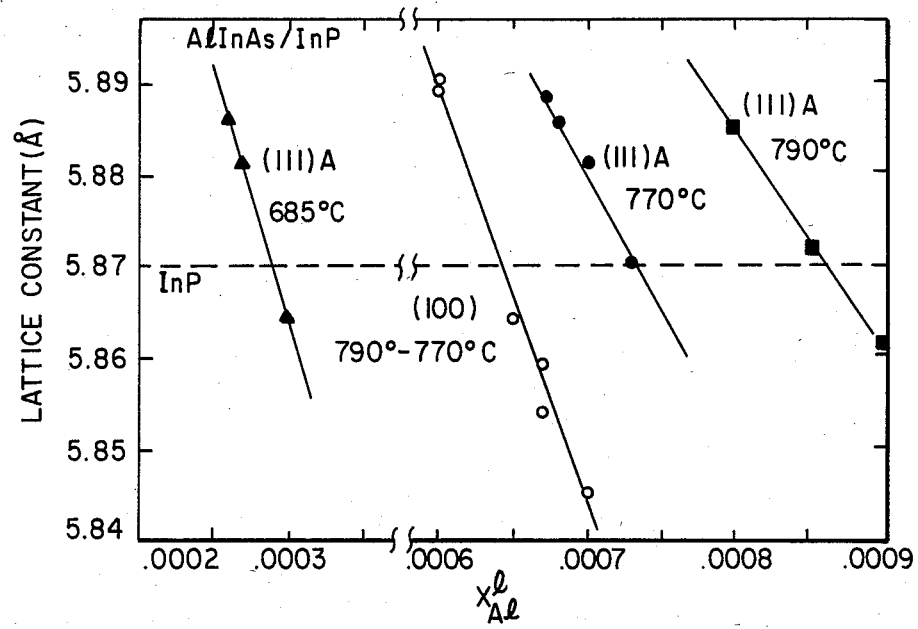
FIG. 1 shows lattice constants of $Al_xIn_{1-x}As$ layers grown on (111)A and (100) InP substrates.

FIG. 1 shows the lattice constants of $Al_xIn_{1-x}As$ epitaxial layers grown on InP (111)A substrates starting from 685°, 770°, and 790° C. as a function of $X_{Al}{}^l$, wherein $X_i{}^l$ represents the atomic fraction of the element i in the solution. The broken line represents the lattice constant of InP. FIG. 1 also shows the previously determined lattice constant of $Al_xIn_{1-x}As$ layers grown on InP (100) substrates in the above-noted publications. The starting growth temperature for the InP (100) substrates was between 790° and 770° C. When $Al_xIn_{1-x}As$ layers were grown from solutions with the same composition, the lattice constant of a layer grown on the (111)A face is larger than that of a layer grown on the (100) face. The solution compositions for the growth of lattice-matched $Al_{0.48}In_{0.52}As$ on InP can be determined from FIG. 1.

For the growth of $Al_xGa_yIn_{1-x-y}As$, the temperatures of 685° and 790° C. were respectively used as the starting growth temperature. The quaternary epitaxial layers were grown on both InP (111)A and (100) substrates. Lattice constants of these layers were also determined from the (400) and (333) $CuK\alpha_1$ reflections by using the double crystal x-ray diffraction technique. The precise diffraction angle of the layers was determined by using the substrate reflection as an internal standard. The results are listed in Table II.

TABLE II

Starting growth temperatures, solution compositions, substrate orientations, lattice constants a (Å) and energy gaps $E_g$ (eV) at 300K for $Al_xGa_yIn_{1-x-y}As$ grown on InP substrates

| Starting growth temperature (°C.) | $X_{Al}{}^l$ | $X_{Ga}{}^l$ | $X_{In}{}^l$ | $X_{As}{}^l$ | Face | a (Å) | $E_g$ (eV) |
|---|---|---|---|---|---|---|---|
| 685 | 0.00012 | 0.025 | 0.07795 | 0.89693 | (111)A | 5.866–5.870 | 0.8305 |
|  | 0.00012 | 0.030 | 0.07514 | 0.89474 |  | 5.858 | 0.7858 |
|  | 0.00015 | 0.015 | 0.0776 | 0.90725 |  | 5.879 | 1.033 |
|  | 0.00015 | 0.020 | 0.0750 | 0.90485 |  | 5.865 | 0.960 |
| 790 | 0.0003 | 0.020 | 0.8097 | 0.170 | (111)A | 5.931 | — |
|  | 0.0003 | 0.025 | 0.8077 | 0.167 |  | 5.919 | — |
|  | 0.0003 | 0.038 | 0.8047 | 0.157 |  | 5.862–5.867 | 0.808 |
|  | 0.0003 | 0.040 | 0.8037 | 0.156 |  | 5.863 | 0.793 |
|  | 0.0004 | 0.020 | 0.8206 | 0.159 |  | 5.884–5.878 | 1.057 |
|  | 0.0004 | 0.025 | 0.8196 | 0.155 |  | 5.873 | 1.010 |

TABLE II-continued

Starting growth temperatures, solution compositions, substrate orientations, lattice constants a (Å) and energy gaps $E_g$ (eV) at 300K for $Al_xGa_yIn_{1-x-y}As$ grown on InP substrates

| Starting growth temperature (°C.) | Solution compositions | | | | Face | a (Å) | $E_g$ (eV) |
|---|---|---|---|---|---|---|---|
| | $X_{Al}^l$ | $X_{Ga}^l$ | $X_{In}^l$ | $X_{As}^l$ | | | |
| | 0.0004 | 0.030 | 0.8186 | 0.151 | | 5.865–5.859 | 0.887 |
| | 0.0005 | 0.010 | 0.8345 | 0.155 | | 5.877–5.884 | 1.240 |
| | 0.0005 | 0.014 | 0.8345 | 0.151 | | 5.873 | 1.028 |
| | 0.0005 | 0.016 | 0.8335 | 0.150 | | 5.866 | 1.040 |
| | 0.0006 | 0.003 | 0.8489 | 0.1475 | | 5.868 | 1.352 |
| | 0.0006 | 0.005 | 0.8484 | 0.146 | | 5.862 | 1.259 |
| | 0.0006 | 0.008 | 0.8474 | 0.144 | | 5.857 | 1.252 |
| | 0.0005 | 0.007 | 0.8355 | 0.157 | (100) | 5.878 | 1.288 |
| | 0.0005 | 0.010 | 0.8345 | 0.155 | | 5.873 | 1.269 |
| | 0.0005 | 0.015 | 0.8335 | 0.151 | | 5.850 | 1.277 |

Figure 2:
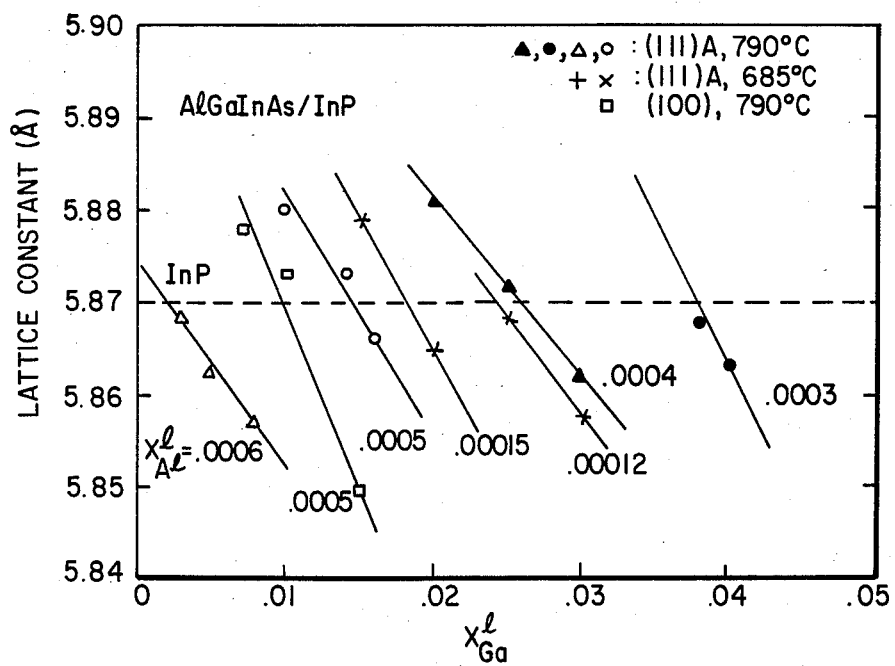
FIG. 2 shows lattice constants of $Al_xGa_yIn_{1-x-y}As$ layers grown on (111)A and (100) InP substrates.

FIG. 2 shows the lattice constant of $Al_xGa_yIn_{1-x-y}As$ layers grown on InP (111)A and (100) substrates starting at 685° and 790° C. The growth solutions containing $X_{Al}^l = 0.00012$ and 0.00015 at 685° C., and $X_{Al}^l = 0.0003, 0.0004, 0.0005,$ and 0.0006 at 790° C. were used for the (111)A face. The growth solution with $X_{Al}^l = 0.0005$ were used for the (100) face. When $Al_xGa_yIn_{1-x-y}As$ layers were grown from solutions with the same composition, the lattice constant of a layer grown on the (111)A face is also larger than that of a layer grown on the (100) face. The solution compositions for the growth of lattice-matched $Al_xGa_yIn_{1-x-y}As$ on InP can be determined from FIG. 2.

Figure 3:
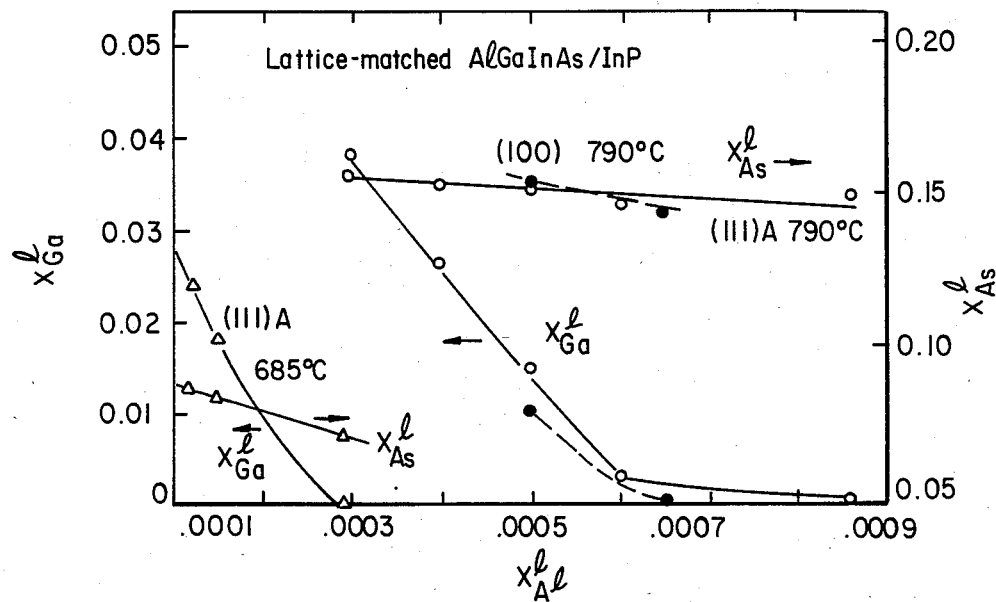
FIG. 3 shows solution composition for LPE growth of lattice-matched $Al_{0.48}In_{0.52}As$ and $Al_xGa_yIn_{1-x-y}$ layers with various compositions.

FIG. 3 shows solution compositions, $X_{Ga}^l$, $X_{As}^l$, and $X_{Al}^l$, required for the LPE growth of lattice-matched $Al_{0.48}In_{0.52}As$ and $Al_xGa_yIn_{1-x-y}As$ layers with various compositions. These data were derived from FIGS. 1 and 2 and the calculated liquidus isotherms. The starting growth temperatures of 685° and 790° C. were used. As shown in FIG. 3, $X_{Ga}^l$ and $X_{As}^l$ decrease as $X_{Al}^l$ increases. When growth solutions have the same $X_{Al}^l$, $X_{Ga}^l$ is smaller for the (100) face than for the (111)A face. The data for $X_{Ga}^l = 0.0$ gives the solution compositions for the growth of lattice-matched $Al_{0.48}In_{0.52}As$ on InP.

The energy gaps of lattice-matched alloys are discussed below:

The energy gap of undoped $Al_xIn_{1-x}As$ and $Al_xGa_yIn_{1-x-y}As$ layers were determined by photoluminescence (PL) measurements at 300 and 77 K. A cw 200-mW Ar ion laser at 5145 Å was used as the optical pumping source. The laser light was chopped at a frequenc of 200 Hz and focused on the sample to a spot about 0.5 mm in diameter. For the PL measurements of longer wavelengths than 0.9 $\mu$m, a JASCO CT-50 monochromator with a PbS detector cooled at 77 K. and a PAR HR-8 lock-in amplifier were used. For the PL measurements of shorter wavelengths than 0.9 $\mu$m, a NARUMI RM-21 monochromator with a Si photodiode (HTV S1336) at room temperature and a NF LI-573 lock-in amplifier were used. The measured results are listed in Tables I and II.

Figure 4:
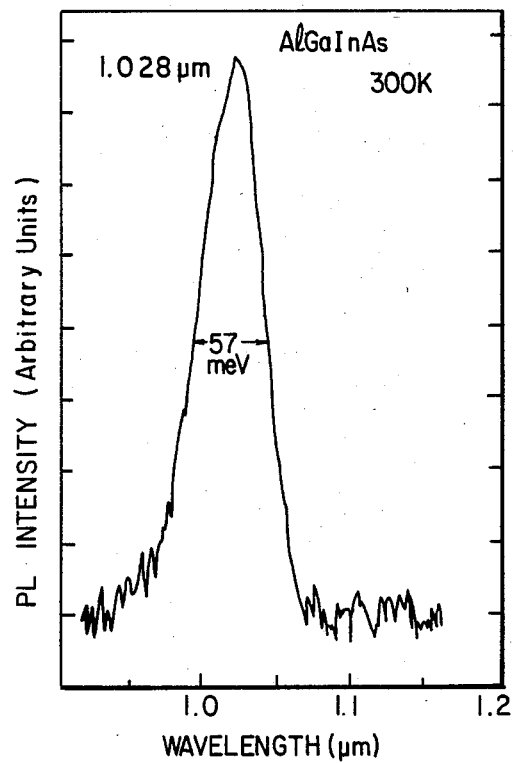
FIG. 4 shows a typical PL spectrum of an $Al_xGa_yIn_{1-x-y}As$ layer.
Figure 6:
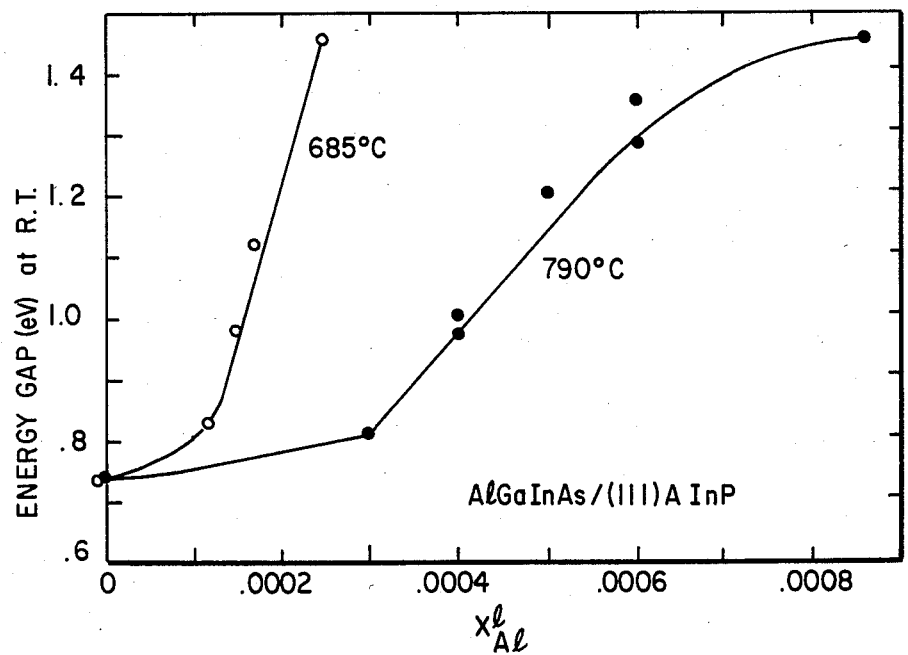
FIG. 6 shows the energy gap of lattic-matched (111)A-oriented $Al_xGa_yIn_{1-x-y}As$ layers as a function of $X_{Al}{}^l$ at 685° C. and 790° C.

A typical PL spectrum of an $Al_xGa_yIn_{1-x-y}As$ layer is shown in FIG. 6. The spectrum was measured at 300 K. The peak wavelength is 1.028 $\mu$m. The thickness and lattice constant of the quaternary layer are 0.5 $\mu$m and 5.873 Å, respectively. This layer was grown on (111)A InP starting from 790° C. at a constant cooling rate of 0.5° C./min. The half-width of the PL spectrum as shown in FIG. 4 is 57 meV, and this value is comparable to the half-width of the PL spectrum of $In_{1-x}Ga_xAs_{1-y}P_y$ layers whose thickness was 1 $\mu$m. This means that the composition variation in this $Al_xGa_yIn_{1-x-y}As$ epitaxial layer is not large.

Figure 5:
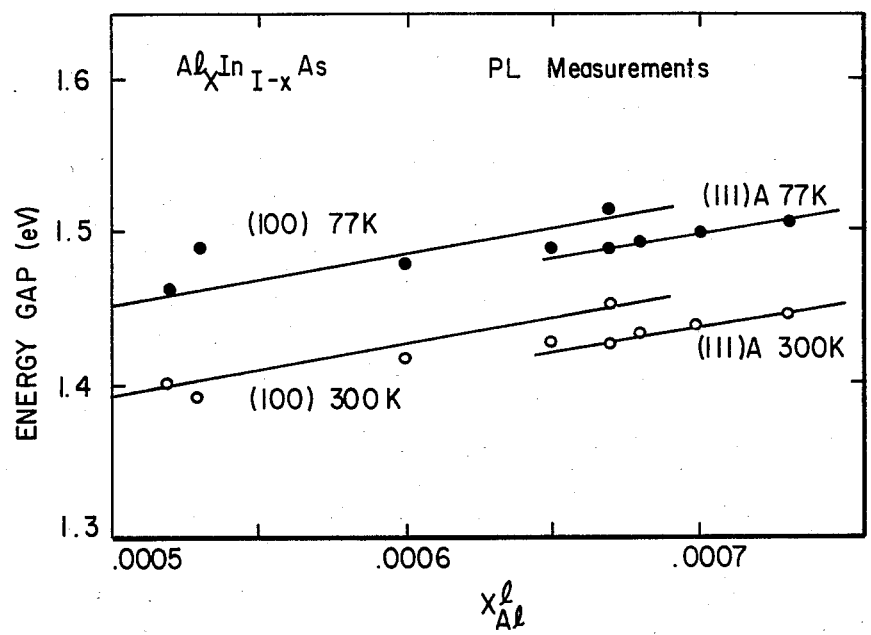
FIG. 5 shows the energy gap of $Al_xIn_{1-x}As$ grown on InP (111)A and (100) substrate as a function of $X_{Al}{}^l$.

FIG. 5 shows the energy gap of $Al_xIn_{1-x}As$ as a function of $X_{Al}^l$. The energy gap of $Al_xIn_{1-x}As$ epitaxial layers grown on InP (111)A and (100) substrates was measured at 300 and 77 K. The starting growth temperature was 770° C. for the (111)A face, and it was between 790° and 770° C. for the (100) face. The energy gap of lattice-matched $Al_{0.48}In_{0.52}As$ was measured to be 1.44 eV. The energy gap increases gradually with $X_{Al}^l$ for both faces. The energy shift between the energy gaps at 300° and 77° K. was found to be 0.06 eV.

FIG. 6 shows the energy gap of lattice-matched (111)A oriented $Al_xGa_yIn_{1-x-y}As$ epitaxial layers as a function of $X_{Al}^l$ at 685° and 790° C. The energy gap was measured at 300° K. The energy gap varies abruptly with increasing $X_{Al}^l$ in the range of the wider energy gap than 0.8 eV. The terminal value at $X_{Al}^l = 0.0$ corresponds to the value of $In_{0.53}Ga_{0.47}As$, and the terminal value at $X_{Al}^l = 0.00025$ and 0.00086 correspond to that of $Al_{0.48}In_{0.52}As$ for the two different growth temperatures. From the information presented in FIGS. 3 and 8, the LPE growth conditions for lattice-matched $Al_xGa_yIn_{1-x-y}As$ layers with desired energy gaps can be easily determined.

The Hall measurements of unintentionally doped $Al_{0.48}In_{0.52}As$ layers are now discussed;

The Hall measurements of unintentionally doped $Al_{0.48}In_{0.52}As$ layers were performed at room temperature, and the carrier concentration, n, and Hall mobility, $\mu$, were derived from the measurements. Two samples of 0.5 $\mu$m thick $Al_{0.48}In_{0.52}As$ layers grown on Fe-doped semi-insulating ($10^6$ $\Omega$-cm) (111)A InP were used for the Hall measurements. In this growth, any baking methods of growth solutions described previously have not been employed, in order to obtain high purity LPE $Al_{0.48}In_{0.52}As$ layers. The results of the Hall measurements were $\mu = 4549$ cm$^2$/Vsec at $n = 4.7 \times 10^{15}$ cm$^{-3}$ and $\mu = 4466$ cm$^2$/Vsec at $n = 5.9 \times 10^{15}$ cm$^{-3}$. These Hall mobilities are the highest of those reported until now, and these carrier concentrations are the lowest of those reported until now. The room temperature Hall mobility of $Al_{0.48}In_{0.52}As$ layers grown by molecular beam epitaxy (MBE) was reported by Cheng et al. According to their data, the Hall mobility was lower than 800 cm$^2$/Vsec at $n = 1 \times 10^{17}$ cm$^{-3}$. The Hall mobility and carrier concentration of undoped $Al_{0.48}In_{0.52}As$ has not been reported. However, the Hall mobilities of $Al_{0.48}In_{0.52}As$ grown by LPE are obviously higher than those of $Al_{0.48}In_{0.52}As$ grown by MBE. High purity $Al_{0.48}In_{0.52}As$ layers with carrier concentrations of $5 \times 10^{15}$ cm$^{-3}$ can be easily obtained by LPE without special purification methods, such as the baking technique.

Figure 7A:
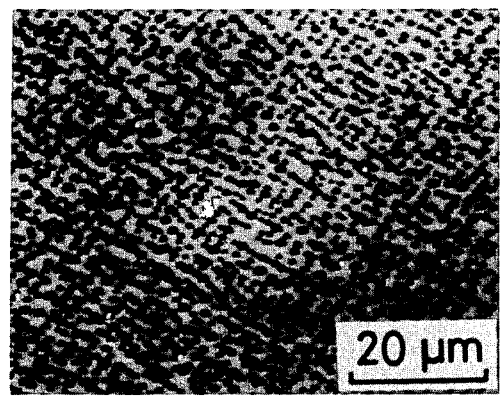
FIGS. 7(a) and 7(b) show typical surfaces of $Al_xIn_{1-x}As$ grown on (100) InP and (111)A InP.
Figure 7B:
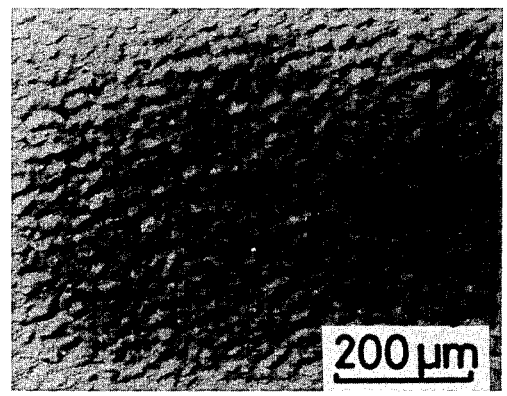

The substrate orientation dependence of surface morphology will now be discussed:

The surface morphology of $Al_{0.48}In_{0.52}As$ and $Al_xGa_yIn_{1-x-y}As$ depends strongly on the orientation of the substrates. For the starting growth temperature of 685° C., the typical surface morphologies of $Al_xIn_{1-x}As$ grown on InP (100) and (111)A substrates are shown in FIGS. 7a and 7b, respectively. As shown in FIG. 7a, only small growth islands appear on the surface of the (100) substrate, and it is very difficult to grow an $Al_xIn_{1-x}As$ epitaxial layer over the entire (100) surface. However, it is easy to grow an $Al_xIn_{1-x}As$ epitaxial layer on the entire surface of the (111)A substrate as shown in FIG. 7b.

Figure 8A:
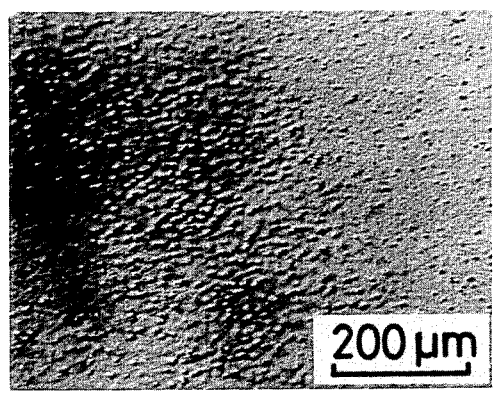
FIGS. 8(a) and 8(b) show typical surfaces of $Al_xIn_{1-x}As$ grown on (100) InP and (111)A InP.
Figure 8B:
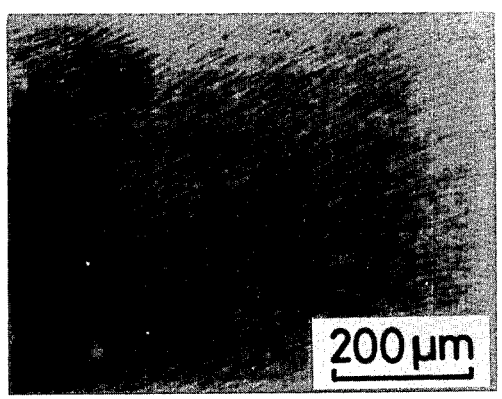

For the high starting growth temperature of 790° C., an $Al_xIn_{1-x}As$ epitaxial layer can be grown all over the surface of the (100) InP substrate as shown in FIG. 8a. However, many surface defects often appear on the (100) surface. In order to obtain $Al_xIn_{1-x}As$ epitaxial layers without surface defects, the epitaxial layers must be grown on the (111)A substrates. FIG. 8b shows the typical surface of $Al_xIn_{1-x}As$ layer grown on (111)A InP starting from 790° C. The (111)A surface is very smooth, and such surface defects as shown in FIG. 8a are not observed. For the growth of $Al_xGa_yIn_{1-x-y}As$, epitaxial layers with smooth surface can also be easily grown on the (111)A substrates.

The reason for surface defects which appear easily on the (100) surface of $Al_xIn_{1-x}As$ layers is related to dissolution of the InP (100) substrates. When $Al_xIn_{1-x}As$ layers were completely removed by using a selective etchant of $HF:HNO_3 = 1:1$, many small holes were observed on the surface of the InP (100) substrates. However, such holes were not observed on the surface of the InP (111)A substrates. As reported previously, the (111)A face is more stable to dissolution than the (100) face. Therefore, the surface defects due to dissolution of the substrates appear more easily on the (100) face than on the (111)A face.

Figure 9:
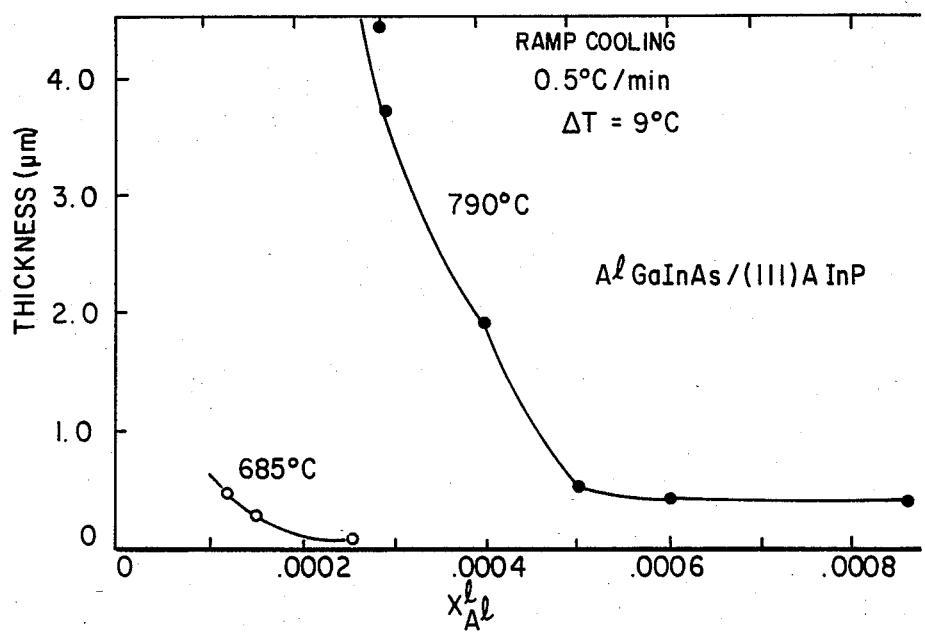
FIG. 9 shows layer thickness of lattice-matched $Al_{0.48}In_{0.52}As$ and $Al_xGa_yIn_{1-x-y}As$ grown on (111)A InP.

The growth rate of $Al_{0.48}In_{0.52}As$ and $Al_xGa_yIn_{1-x-y}As$ is discussed below:

FIG. 9 shows the layer thickness of lattice-matched $Al_{0.48}In_{0.52}As$ and $Al_xGa_yIn_{1-x-y}As$ as a function of $X_{Al}{}^l$. These layers were grown on InP (111)A substrates by the ramp cooling method. A constant cooling rate of 0.5° C./min was used. The starting growth temperatures were 685° and 790° C., and the cooled temperature interval was 9° C. As shown in FIG. 9, the layer thickness of $Al_xGa_yIn_{1-x-y}As$ increases as $X_{Al}{}^l$ decreases. This means that the layer thickness of $Al_xGa_yIn_{1-x-y}As$ increases as x (Al content in the alloy) decreases. The growth rate of $Al_{0.48}In_{0.52}As$ ternary layers is the smallest of the Al-Ga-In-As system. The growth rate of $Al_xGa_yIn_{1-x-y}As$ increases rapidly when $X_{Al}{}^l$ becomes smaller than 0.0005.

Figure 10:
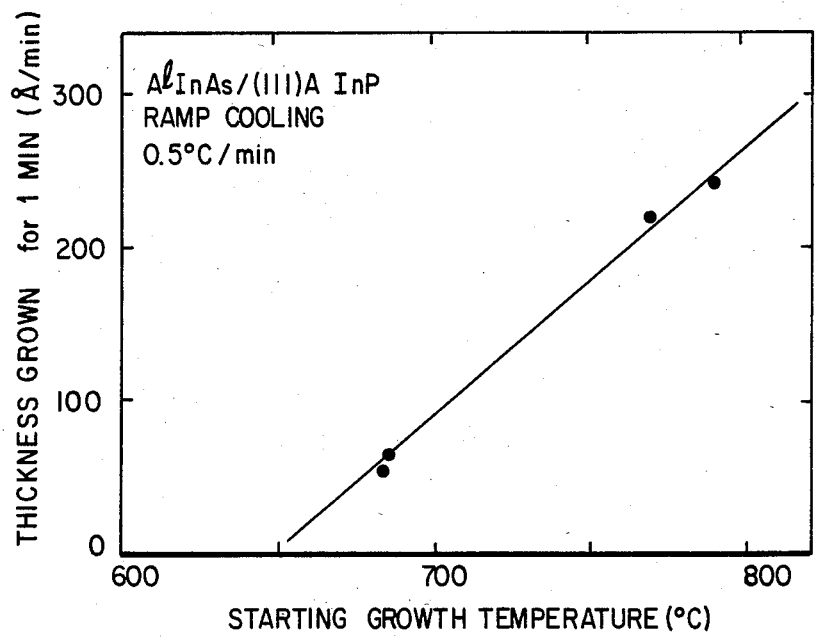
FIG. 10 shows layer thickness of $Al_xIn_{1-x}As$ grown for 1 min. as a function of the starting growth temperature.

FIG. 10 shows the layer thickness of $Al_xIn_{1-x}As$ grown for 1 min as a function of the starting growth temperature. The growth was performed on (111)A InP by the ramp cooling method. A constant cooling rate of 0.5° C./min was used. As shown in FIG. 10, the layer thickness per 1 min was only 60 Å at 685° C. and 240 Å at 790° C. Therefore, very thin layers can be grown under good control by using the ordinary LPE growth apparatus with a sliding graphite boat. It is expected that a 40 Å thick layer can be grown at 790° C. for the growth time of 10 sec.

Figure 11:
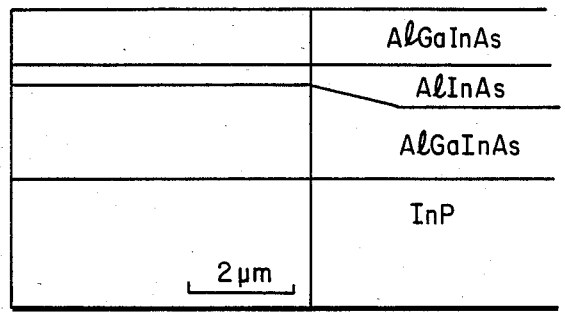
FIG. 11 shows an AlGaInAs/AlInAs/AlGaInAs/(111)A InP heterostructure.
Figure 12:
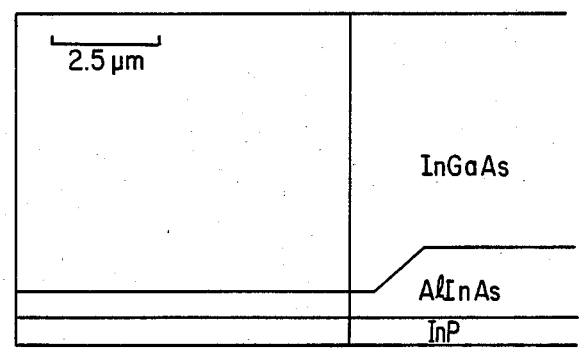
FIG. 12 shows an InGaAs/AlInAs/(111)A InP heterostructure.

The growth of heterostructures is now described:

In order to fabricate devices using $Al_{0.48}In_{0.52}As$ or $Al_xGa_yIn_{1-x-y}As$, it is necessary to obtain heterostructures. $Al_xGa_yIn_{1-x-y}As$ can be grown on $Al_{0.48}In_{0.52}As$ without dissolution. $Al_{0.48}In_{0.52}As$ can also be grown on $Al_xGa_yIn_{1-x-y}As$, but the dissolution of $Al_{0.48}In_{0.52}As$ into the Al-Ga-In-As growth solution becomes more severe as the Al content in the quaternary alloy decreases. FIG. 11 shows the $Al_xGa_yIn_{1-x-y}As/Al_{0.48}In_{0.52}As/Al_xGa_yIn_{1-x-y}As$ heterostructure grown on (111)A InP. The starting growth temperature was 790° C. The wavelength of the $Al_xGa_yIn_{1-x-y}As$ layers was 1.0 μm at 300 K. $In_{0.53}Ga_{0.47}As$ can be grown on $Al_{0.48}In_{0.52}As$ as shown in FIG. 12. These layers were grown on (111)A InP. $In_{0.53}Ga_{0.47}As$ was grown on $Al_{0.48}In_{0.52}As$ at 650° C. by the ramp cooling method. $In_{1-x}Ga_xAs_{1-y}P_y$ can also be grown on $Al_{0.48}In_{0.52}As$, but the growth of $Al_{0.48}In_{0.52}As$ on $In_{0.53}Ga_{0.47}As$ was more difficult.

Figure 13:
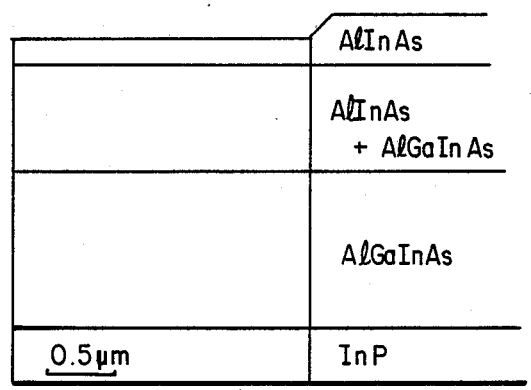
FIG. 13 shows a multilayer structure consisting of AlInAs and AlGaInAs grown on (111)A InP.
Figure 14:
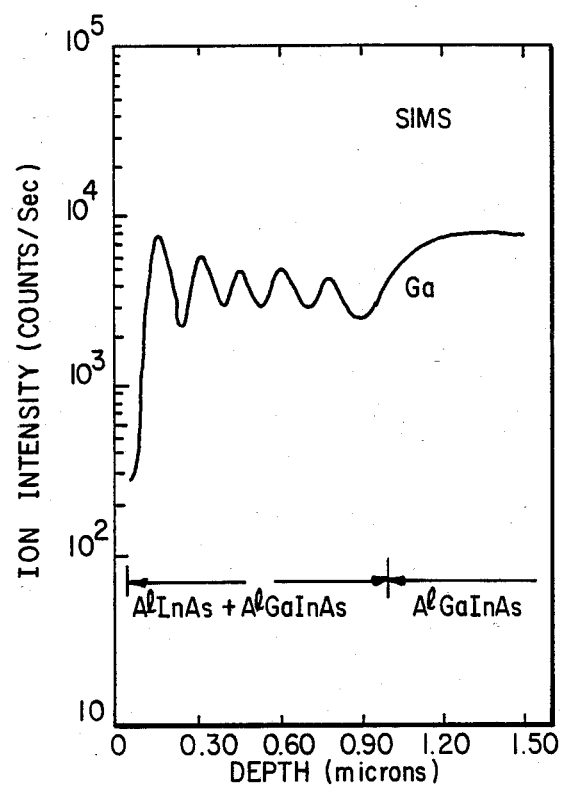
FIG. 14 shows an $O_2{}^+$/SIMS depth profiling measurement of $^{71}Ga$ in the multilayer structure wafer consisting of AlInAs and AlGaInAs.

FIG. 13 shows a multilayer structure consisting of $Al_{0.48}In_{0.52}As$ and $Al_xGa_yIn_{1-x-y}As$ grown on (111)A InP. The thickness of the $Al_{0.48}In_{0.52}As$ and $Al_xGa_yIn_{1-x-y}As$ layers were about 0.05 μm and 0.1 μm, respectively. The growth was started from 781° C. at a constant cooling rate of 0.5° C./min, and the growth time of each layer was 1 min. Since a slightly supercooled (2°-3° C.) solution was used for the growth of $Al_{0.48}IN_{0.52}As$ layers, the growth rate was higher than that shown in FIG. 10. The wavelength of the $Al_xGa_yIn_{1-x-y}As$ layers was 0.98 μm at 300° K. FIG. 14 shows the $O_2^+$/SIMS depth profile of $^{71}Ca$ from the surface of this sample. As shown in FIG. 14, this sample has 11 layers. The abruptness of the heterointerfaces cannot be accurately known from FIG. 14 because of the limit of resolution of SIMS depth profiling measurements. A thinner multilayer structure can be grown by using a shorter growth time.

EXAMPLE

This invention is explained concretely by the way of the first embodiment for growth of the $Al_xIn_{1-x}As$ crystal, the second embodiment for growth of the $Al_xGa_yIn_{1-x-y}As$ and the third embodiment for growth of the $Al_xGa_yIn_{1-x-y}As$ crystal and then the $Al_xIn_{1-x}As$ crystal. The following embodiments illustrate, but in no way limit the present invention:

(i) Embodiment for growth of $Al_xIn_{1-x}As$ crystal

A slide boat for ordinary liquid phase epitaxial growth accommodating the InP substrate, melt-back liquid (explained later) and raw material crystal of growth liquid is placed within a quartz reaction pipe through which the pure hydrogen ($H_2$) is flowed. However, the upper surface of InP substrate is prepared as the (111)A crystal plane and is protected by the InP cover plate.

The internal temperature is raised up to 810° C. and is held in such condition for 30 minutes. Thereafter, the temperature is lowered at the cooling rate of 0.3° C./min and the meltback of substrate and growth of the $Al_xIn_{1-x}As$ crystal are performed as follows:

(a) Meltback of InP substrate
Liquid composition:
In:InP = 2.1844 g:0.0695 g
Temperature: 770° C.
Time: About 10 seconds (b) Growth of AlInAs crystal
Liquid composition:
AlIn:InAs:In = 4.0082 g:1.2207 g 0.01085 g Where, AlIn is a solid solution, containing Al of 0.1 wt%, namely 0.0235 wt% in In. Since Al does not easily dissolve and mix uniformly into discrete In (because of monotetic reaction, discussed above), an AlIn mother alloy is used.

Atomic fraction of liquid:
$X_{Al}{}^l = 0.00073$
$X_{In}{}^l = 0.86527$
$X_{As}{}^l = 0.13400$
Temperature: About 770°→764° C.

Growth thickness: About 0.46 μm

When growth of crystal is completed, temperature is rapidly cooled down to room temperature.

Figure 15:
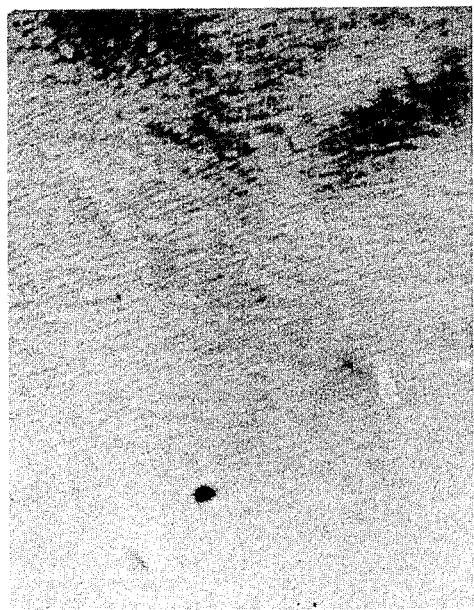
FIG. 15 is a microphotograph indicating the surface condition of the crystal of the present invention.

The surface condition of AlInAs crystal grown by this embodiment is shown in a microphotograph (125 times) of FIG. 15. As is clear from this figure, according to this invention, crystal defects as shown in the prior art shown in FIG. 7a do not appear and the surface condition is excellent.

As a result of measuring the lattice constant of the AlInAs crystal in this embodiment by the X-ray analysis method, lattice mismatching ratio Δa/a to the InP crystal was as low as $0.3 \times 10^{-4}$ or less and the peak wavelength of photoluminescence was confirmed as about 0.855 μm, the forbidden band was 1.45 eV and the composition was $Al_{0.48}In_{0.52}As$.

(ii) Embodiment of $Al_xGa_yIn_{1-x-y}As$ crystal growth

As in the embodiment of said AlInAs crystal growth, the liquid phase growth of the $Al_xGa_yIn_{1-x-y}As$ crystal is carried out. In this embodiment, a cooling speed is set to 0.5° C./min.

(a) Meltback of InP substrate:
Liquid composition:
In:InP=2.3207 g:0.07045 g
Temperature: 790° C.
Time: About 10 seconds (b) AlGaInAs crystal growth
Liquid composition:
AlIn:InAs:GaAs:In=2.74588 g:1.47505 g:0.211630 g:1.98785 g AlIn is also used here because of the same reason as explained above.

Atomic fraction of liquid:
$X_{Al}^l = 0.004$
$X_{Ga}^l = 0.0250$
$X_{In}^l = 0.8196$
$X_{As}^l = 0.1550$
Temperature: About 790°→781° C.
Growth thickness: About 1.92 μm As in the case of the AlInAs crystal surface in the above embodiment, no crystal defects were observed on the AlGaInAs crystal surface of this embodiment. The lattice matching was also good and the peak wavelength of photo luminescence was about 1.228 μm.

(iii) Embodiment where $Al_xGa_yIn_{1-x-y}As$ crystal is grown first and then $Al_xIn_{1-x}As$ crystal is grown thereon The liquid phase growth is carried out as in embodiments (i) and (ii), above. The cooling speed in this embodiment is also set to 0.5° C./min as in embodiment (ii).

(a) Meltback of InP substrate
Liquid composition:
In:InP=2.22795 g:0.0669 g
Temperature: 790° C.
Time: About 10 seconds (b) AlGaInAs crystal growth
Liquid composition:
AlIn:InAs:GaAs:In=5.4489 g:2.61379 g:0.1386 g:2.0724 g AlIn is used for the same reason as explained above.
Atomic fraction of liquid:
$X_{Al}^l = 0.0005$
$X_{Ga}^l = 0.0100$
$X_{In}^l = 0.8345$
$X_{As}^l = 0.1550$
Temperature: About 790°→781° C.

Growth thickness: About 0.6 μm
Photo luminescence peak wavelength: About 1.0 μm (c) AlInAs crystal growth
Liquid composition:
AlIn:InAs:In=5.79005 g:2.3487 g:1.0248 g
AlIn is used for the same reason as explained above.
Temperature: 781°→773° C.
Growth thickness: About 0.5 μm In regard to the AlGaInAs-AlInAs crystal obtained by this embodiment, excellent surface condition and lattice matching are obtained as in embodiment (i).

As in embodiment (i) explained above, good results have been obtained by carrying out the processes explained below by the liquid phase expitaxial growth method wherein the InGaAsP crystal, for example, is grown on the InP substrate having the main plane of (111)A, and then the $Al_{0.48}In_{0.52}As$ crystal or $Al_xGa_yIn_{1-x-y}As$ crystal is grown on such InGaAsP layer.

As explained above, according to this invention, the $Al_xIn_{1-x-y}As$ (x=0.48) crystal having a forbidden band which is very much larger than that of the material considered as the object of researches in semiconductor devices or the $Al_xGa_yIn_{1-x-y}As$ crystal having a wider and changeable forbidden band gap can be grown without any crystal defects by the liquid phase epitaxial growth method, through lattice matching to the InP which occupies the main part in the III-V group compound semiconductor.

In this invention, the crystal is grown in the (111)A plane and, therefore, it is adequate to select the (110) plane as the cleavage surface of laser. However, the resonant surface of laser can also be formed, since the parallel cleavage surface can be formed by selecting only the same cleavage direction.

Accordingly, a semiconductor light emitting device, photo detector device and various semiconductor devices, such as field effect transistor, can be formed easily by selecting and combining $Al_xIn_{1-x}As$ and $Al_xGa_yIn_{1-x-y}As$ together with InP, indium-gallium-arsenic/phosphide (InGaAsP) and indium-gallium-arsenide (InGaAs). In this sense this invention contributes much to development of the III-V group compound semiconductor device and the practical use thereof.

What is claimed is:

1. A liquid phase epitaxial growth method comprising the steps of:
   (a) preparing an indium phosphide substrate with crystal plane (111)A, and
   (b) growing an epitaxial layer of an aluminum-indium-arsenide ($Al_xIn_{1-x}As$) by liquid phase epitaxy on said substrate, wherein x=0.48.

2. A liquid phase epitaxial growth method comprising the steps of:
   (a) preparing an indium phosphide substrate with crystal plane (111)A, and
   (b) growing an epitaxial layer of an aluminum-gallium-indium-arsenide ($Al_xGa_yIn_{1-x-y}As$) by liquid phase epitaxy on said substrate, wherein $0<x<0.48$, $0<y<0.47$.

3. A liquid phase epitaxial growth method comprising the steps of:
   (a) preparing an indium phosphide substrate with crystal plane (111)A,
   (b) growing a first epitaxial layer of aluminum-gallium-indium-arsenide ($Al_xGa_yIn_{1-x-y}As$) by liquid phase epitaxy on said substrate, wherein $0<x<0.48$, $0<y<0.47$, and (c) growing a second epitaxial layer of aluminum-indium-arsenide ($Al_xIn_{1-x}As$) by liquid phase epitaxy on said first epitaxial layer, wherein $x=0.48$.

4. A liquid phase epitaxial growth method comprising the steps of:
 (a) preparing an indium phosphide substrate with crystal plane (111)A,
 (b) growing a first epitaxial layer comprising aluminum-indium-arsenide ($Al_xIn_{1-x}As$) by liquid phase epitaxy on said substrate, wherein $x=0.48$, and
 (c) growing a second epitaxial layer comprising aluminum-gallium-indium-arsenide ($Al_xGa_yIn_{1-x-y}As$) by liquid phase epitaxy on said first epitaxial layer, wherein $0<x<0.48$, $0<y<0.47$.

5. A liquid phase epitaxial growth method comprising the steps of:
 (a) preparing an indium phosphide substrate with crystal plane (111)A,
 (b) growing a first epitaxial layer having crystal plane (111)A by liquid phase epitaxy on said substrate, and
 (c) growing a second epitaxial layer of aluminum-indium-arsenide ($Al_xIn_{1-x}As$) by liquid epitaxy on said first epitaxial layer, wherein $x=0.48$.

6. A liquid phase epitaxial growth method comprising the steps of:
 (a) preparing an indium phosphide substrate with crystal plane (111)A,
 (b) growing a first epitaxial layer having crystal plane (111)A by liquid phase epitaxy on said substrate, and
 (c) growing a second epitaxial layer of aluminum-gallium-indium-arsenide ($Al_xGa_yIn_{1-x-y}As$) on said first epitaxial layer, wherein $0<x<0.48$, $0<y<0.47$.

* * * * *